United States Patent
You

(10) Patent No.: US 7,368,204 B2
(45) Date of Patent: May 6, 2008

(54) MASK FOR LASER CRYSTALLIZATION AND CRYSTALLIZATION METHOD USING THE SAME

(75) Inventor: JaeSung You, Seoul (KR)

(73) Assignee: LG. Philips LCD. Co., Ltd., Seoul (KR)

( * ) Notice: Subject to any disclaimer, the term of this patent is extended or adjusted under 35 U.S.C. 154(b) by 750 days.

(21) Appl. No.: 10/984,068

(22) Filed: Nov. 9, 2004

(65) Prior Publication Data

US 2005/0142451 A1 Jun. 30, 2005

(30) Foreign Application Priority Data

Dec. 26, 2003 (KR) .................. 10-2003-0097879

(51) Int. Cl.
*G03F 1/00* (2006.01)
*G03C 5/00* (2006.01)
(52) U.S. Cl. ............................ 430/5; 430/22
(58) Field of Classification Search .............. 430/5, 430/22, 394; 117/4, 95, 97; 438/166
See application file for complete search history.

(56) References Cited

U.S. PATENT DOCUMENTS 7,033,434 B2 * 4/2006 Kim .......................... 117/4

FOREIGN PATENT DOCUMENTS

| KR | 96-16314 | 12/1996 |
| KR | 2002-0064138 | 8/2002 |
| KR | 2003-0034730 | 5/2003 |

* cited by examiner

*Primary Examiner*—S. Rosasco
(74) *Attorney, Agent, or Firm*—Brinks Hofer Gilson & Lione

(57) ABSTRACT

A mask for laser crystallization includes a transmissive portion defining a crystallization pattern and an alignment pattern. The alignment pattern includes a first pattern group having a size corresponding to the crystallization pattern and a second pattern group having a plurality of radial bars surrounding the first pattern group. A shielding portion surrounds the transmissive portion.

36 Claims, 10 Drawing Sheets

MASK FOR LASER CRYSTALLIZATION AND CRYSTALLIZATION METHOD USING THE SAME

This application claims the benefit of Korean Patent Application No. 2003-97879, filed on Dec. 26, 2003, which is hereby incorporated by reference.

BACKGROUND

1. Field

The present application relates to a crystallization method of a silicon thin film, and more particularly, to a mask for laser crystallization and a crystallization method using the mask.

2. Discussion of the Related Art

Flat panel display (FPD) devices having high portability and low power consumption have been the subject of recent research and development. Among various types of FPD devices, liquid crystal display (LCD) devices are commonly used as monitors for notebook and desktop computers because of their ability to display high-resolution images, wide ranges of different colors, and moving images.

In general, an LCD device includes a color filter substrate and an array substrate separated from each other by a liquid crystal layer. The color filter substrate and the array substrate include a common electrode and a pixel electrode, respectively. When a voltage is supplied to the common electrode and the pixel electrode, an electric field is generated that affects orientation of liquid crystal molecules of the liquid crystal layer due to optical anisotropy within the liquid crystal layer. Consequently, light transmittance characteristics of the liquid crystal layer become modulated and images are displayed by the LCD device.

Active matrix type display devices are commonly used because of their superior display of moving images. Active matrix-type display devices include pixel regions that are disposed in matrix and a switching element, such as a thin film transistor (TFT), is formed at each pixel region. Recently, LCD devices that include TFTs using polycrystalline silicon (p-Si) have been widely researched and developed. In an LCD device using polycrystalline silicon, specifically, both a display region TFT and a driving circuit may be formed on one substrate. Moreover, since an additional process of connecting the TFT of the display region and the driving circuit is not necessary, the total fabrication process for the LCD device is simplified. Since the field effect mobility of polycrystalline silicon is several-hundred times as great as that of amorphous silicon, the LCD device using polycrystalline silicon has a short response time and high stability against heat and light.

FIG. 1 is a schematic view showing a liquid crystal display device according to the related art where a display TFT and a driving circuit are formed on one substrate. In FIG. 1, a driving circuit portion 3 and a pixel portion 4 are defined on a single substrate 2. The pixel portion 4 is disposed at a central portion of the substrate 2, while the driving portion 3 is disposed at left portion and top portions of the pixel portion 4. The driving circuit portion includes a gate driving circuit 3a and a data driving circuit 3b. The pixel portion 4 includes a plurality of gate lines 6 connected to the gate driving circuit 3a and a plurality of data lines 8 connected to the data driving circuit 3b. The gate line 6 and the data line 8 cross each other to define a pixel region and a pixel electrode 10 is formed in the pixel region. A thin film transistor (TFT) "T" as a switching element is connected to the pixel electrode 10. The gate driving circuit 3a supplies a scan signal to the TFT "T" through the gate line 6 and the data driving circuit 3b supplies a data signal to the pixel electrode 10 through the data line 8. The gate driving circuit 3a and the data driving circuit 3b are connected to an input terminal 12 of external signals. Accordingly, the gate driving circuit 3a and the data driving circuit 3b process the externals signals from the input terminal 12 to generate the scan signal and the data signal.

Even though not shown in FIG. 1, the TFT includes a semiconductor layer, a gate electrode, a source electrode and a drain electrode, and the semiconductor layer uses polycrystalline silicon because of higher field effect mobility.

Polycrystalline silicon may be formed by crystallizing amorphous silicon. A laser annealing method, where a laser beam is irradiated onto an amorphous silicon film, finds wide use as a crystallization method. However, since the surface temperature of the irradiated amorphous silicon film reaches about 1400° C., the top surface of the silicon film is apt to oxidize. Particularly, since the laser beam irradiates the silicon film several times during the laser annealing method, silicon oxide ($SiO_2$) may be created on the top surface of the silicon film when the irradiation of the laser beam is performed in ambient air. Accordingly, the laser beam may be irradiated under a vacuum of about $10^{-7}$ to $10^{-6}$ Torr. To solve the above problems of the laser annealing method, a sequential lateral solidification (SLS) method using a laser beam has been suggested and researched.

The SLS method utilizes the phenomenon that grains of a silicon film grow along a direction perpendicular to a border surface of a liquid phase region and a solid phase region of the silicon film. In the SLS method, grains grow along one lateral direction by adjusting an energy density and an irradiation range of a laser beam and moving the laser beam (Robert S. Sposilli, M. A. Crowder, and James S. Im, Material Research Society Symp. Proc. Vol. 452, pages 956-957, 1997). Since the grain size of a silicon film is enlarged by the SLS method, a TFT having a channel region of single crystalline silicon may be obtained.

FIG. 2 is a schematic plane view showing a mask for laser crystallization according to the related art. In a SLS method, a mask having slits is disposed over an amorphous silicon layer and the amorphous silicon layer is crystallized by repetition of irradiation of a laser beam and movement of the mask along two directions. In FIG. 2, a unit area of an amorphous silicon layer may be irradiated twice and a mask 16 for laser crystallization may be referred to as a two-shot type. The mask 16 has a crystallization pattern 14 including a plurality of slits 13, each of which has a width of several micrometers. The crystallization pattern 14 has first and second blocks "IIa" and "IIb." The slits 13 in the first block "IIa" alternate with the slits 13 in the second block "IIb." When an amorphous silicon layer is crystallized, the mask 16 may move by a distance corresponding to a width of each block "IIa" or "IIb." Accordingly, a unit area of the amorphous silicon layer is crystallized by twice irradiation of a laser beam. A size of the laser beam irradiated onto the mask 16 corresponds a first region "IIIc," where the laser beam has a uniform energy density.

FIG. 3A is a schematic plane view showing a size of a laser beam for laser crystallization according to the related art, FIG. 3B is a schematic cross-sectional view, which is taken along a line "IIIa-IIIa" of FIG. 3A, showing a profile of a laser beam for a laser crystallization according to the related art and FIG. 3C is a schematic cross-sectional view, which is taken along a line "IIIb-IIIb" of FIG. 3A, showing a profile of a laser beam for laser crystallization according to the related art. In FIG. 3A, a laser beam 20 includes a first region "IIIc" having a first energy density corresponding to a complete melting regime at a central portion and a second region "IIId" having a second energy density lower than the first energy density at a peripheral portion.

In FIGS. 3B and 3C, each of transverse and longitudinal profiles of a laser beam 20 includes a first region "IIIc" and a second region "IIId." The first region "IIIc" may be referred to as a top hat region. A first energy density of the first region "IIIc" corresponds to a complete melting regime and a second energy density of the second region "IIId" corresponds to a partial melting regime. Since a laser beam having an energy density corresponding to a complete melting regime is irradiated in a SLS method, a third region "IIIe" corresponding to a crystallization pattern 14 (of FIG. 2) should be disposed inside the first region "IIIc" for laser crystallization. The third region "IIIe" may be designed smaller than the first region "IIIc" on the basis of alignment margin.

However, when the mask for laser crystallization is changed, the mask may be misaligned over the alignment margin. Specifically, the misalignment of the mask may become more serious for a long rest time period between laser annealing processes or a long time period of a laser annealing process.

FIGS. 4A and 4B are a schematic plane view and a schematic cross-sectional view, respectively, showing misalignment of a mask for laser crystallization according to the related art. In FIGS. 4A and 4B, a mask 16 for laser crystallization is misaligned with a laser beam such that a first region "IIIc" of the laser beam does not cover a crystallization pattern 14. Accordingly, a laser beam corresponding to a slope region "IV" having a third energy density lower than a first energy density of the first region "IIIc" may be irradiated onto an amorphous silicon layer, thereby deteriorating crystallinity of a resultant polycrystalline silicon layer.

An LCD device where a driving circuit and a pixel TFT are formed on a single substrate may be fabricated using a multi-pattern mask for laser crystallization. Since the requirements of a driving TFT in the driving circuit is different from that of the pixel TFT, a semiconductor layer of the driving TFT may be crystallized using a crystallization pattern different from that for a semiconductor layer of the pixel TFT. In order to simplify the process and reduce the production cost, a multi-pattern mask for laser crystallization having several different crystallization patterns may be used for an LCD device having a driving circuit and a pixel TFT on a single substrate. Since the multi-pattern mask is aligned with the amorphous silicon layer more frequently, the misalignment may cause more serious problems in crystallinity.

SUMMARY

In various aspects, a mask for laser crystallization having alignment patterns where misalignment between the mask and a laser beam is minimized, and a crystallization method using the same, are described. In addition, a multi-pattern mask for laser crystallization having crystallization patterns for a driving circuit and a pixel thin film transistor where misalignment between the mask and a laser beam is minimized, and a crystallization method using the same, are described.

By way of introduction only, in one aspect, a mask for laser crystallization includes a transmissive portion defining a crystallization pattern and an alignment pattern, and a shielding portion surrounding the transmissive portion. The alignment pattern includes a first pattern group having substantially the same size as the crystallization pattern and a second pattern group having a plurality of sub-patterns, such as radial bars, surrounding the first pattern group.

In another aspect, a method of crystallizing an amorphous silicon layer includes: providing a mask for laser crystallization including a transmissive portion and a shielding portion surrounding the transmissive portion, the transmissive portion defining a crystallization pattern and an alignment pattern, the alignment pattern including a first pattern group having substantially the same size as the crystallization pattern and a second pattern group having a plurality of sub-patterns, such as radial bars, surrounding the first pattern group; irradiating a first laser beam onto the amorphous silicon layer through the alignment pattern to form a polycrystalline silicon pattern; aligning the first laser beam with the mask by measuring a symmetry of the polycrystalline silicon pattern; and irradiating a second laser beam onto the amorphous silicon layer through the crystallization pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, example of which is illustrated in the accompanying drawings. Wherever possible, similar reference numbers will be used throughout the drawings to refer to the same or like parts.

Figure 1:
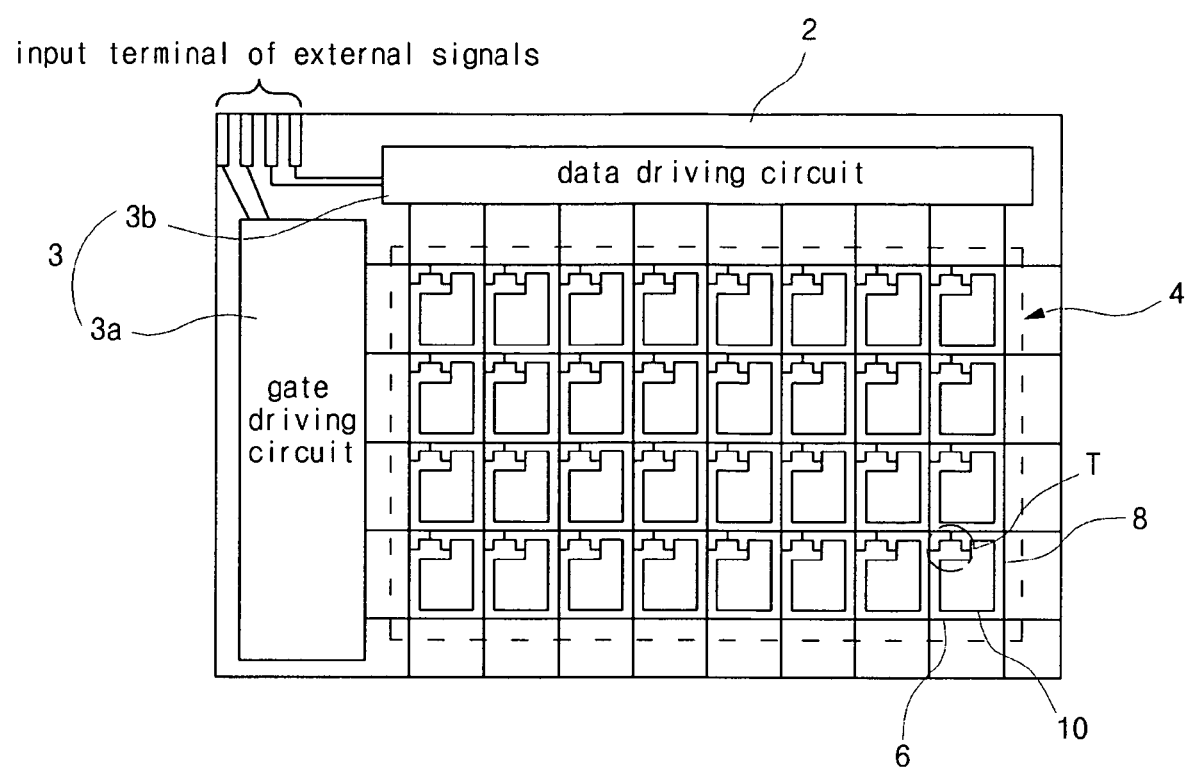
FIG. 1 is a schematic view showing a liquid crystal display device according to the related art where a display TFT and a driving circuit are formed on one substrate.
Figure 2:
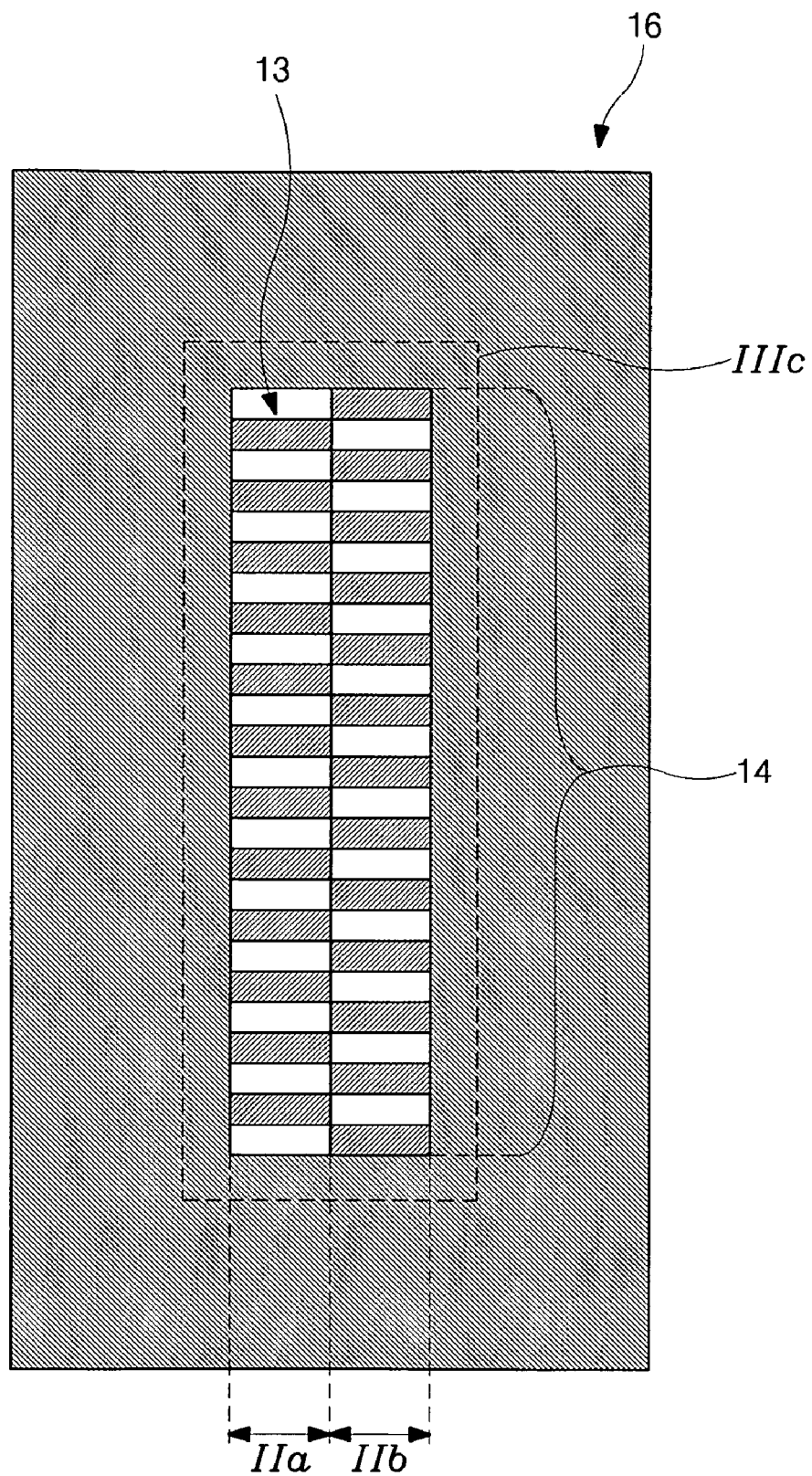
FIG. 2 is a schematic plane view showing a mask for laser crystallization according to the related art.
Figure 3A:
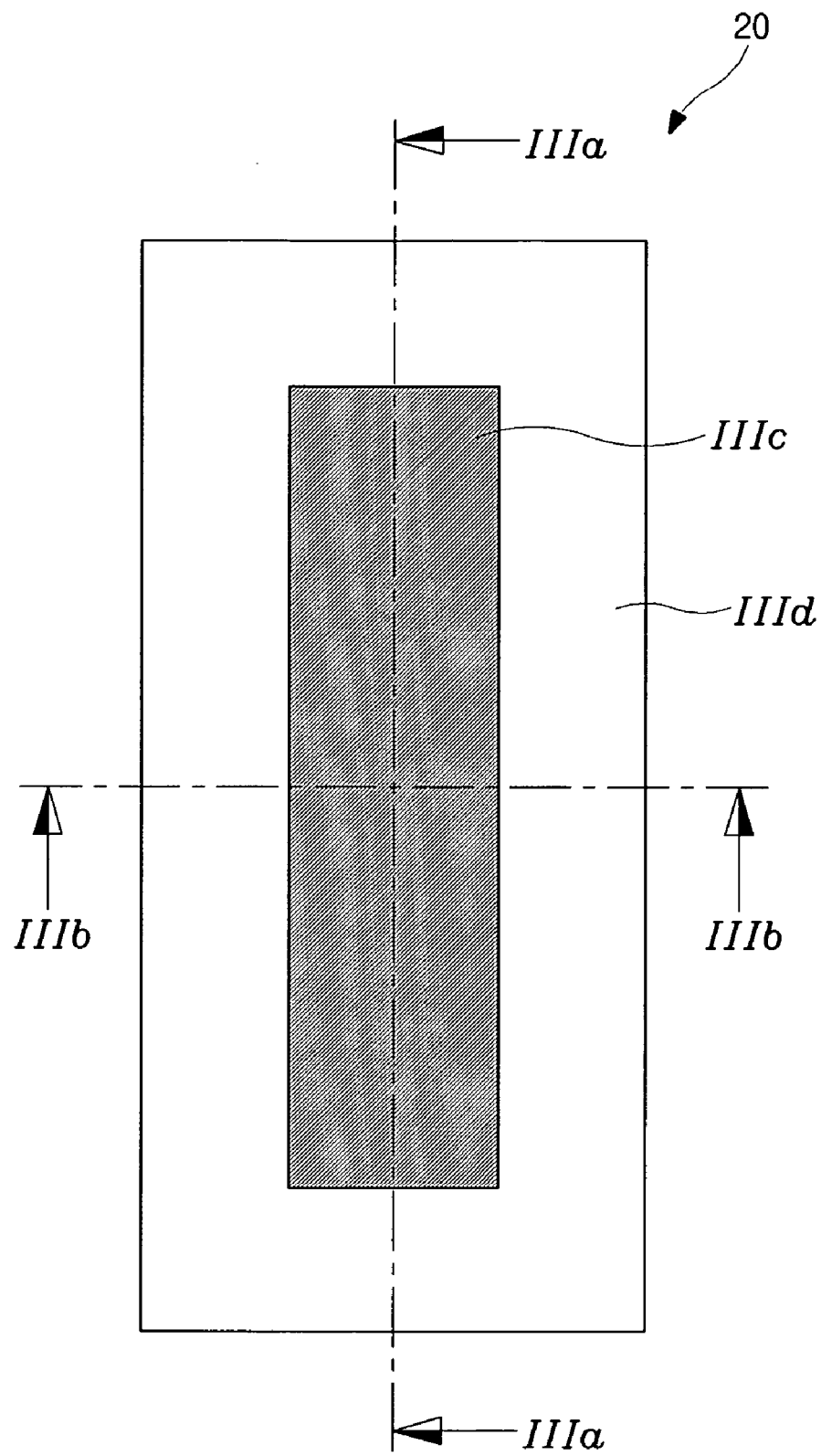
FIG. 3A is a schematic plane view showing a size of a laser beam for laser crystallization according to the related art.
Figure 3B:
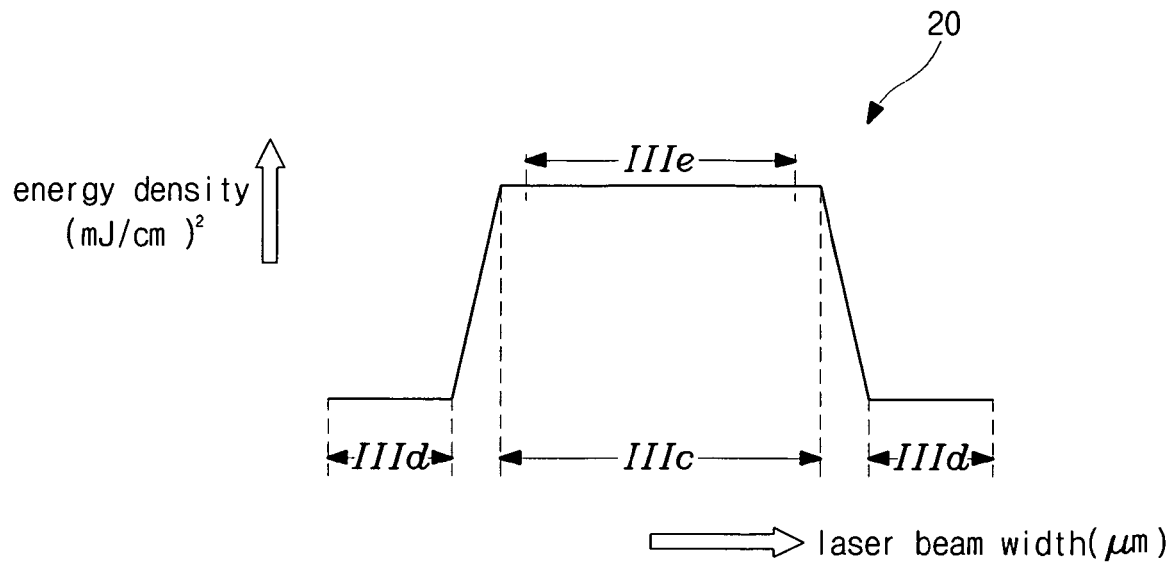
FIG. 3B is a schematic cross-sectional view, which is taken along a line "IIIa-IIIa" of FIG. 3A, showing a profile of a laser beam for a laser crystallization according to the related art.
Figure 3C:
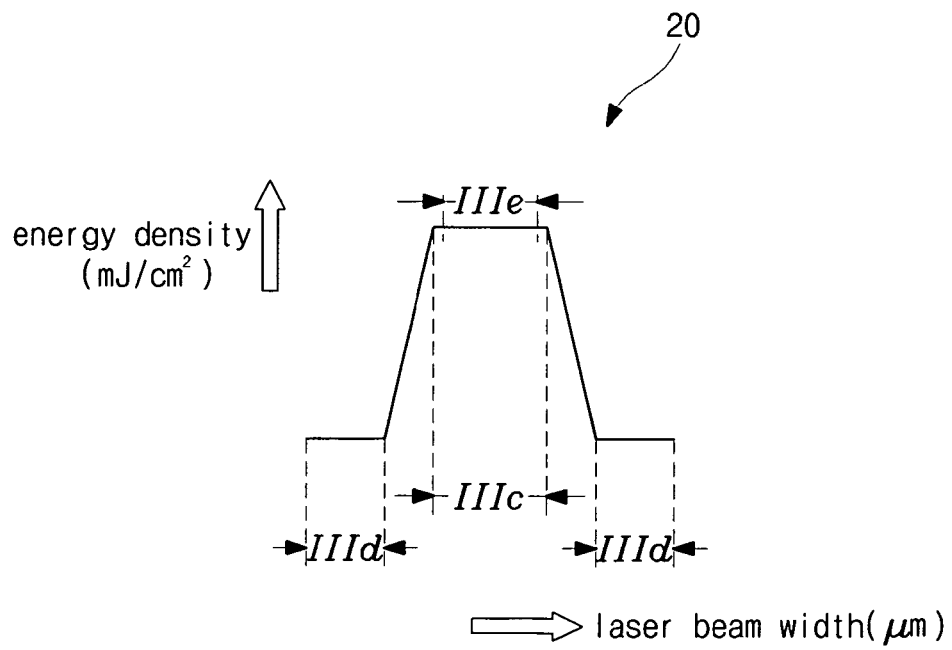
FIG. 3C is a schematic cross-sectional view, which is taken along a line "IIIb-IIIb" of FIG. 3A, showing a profile of a laser beam for laser crystallization according to the related art.
Figure 4A:
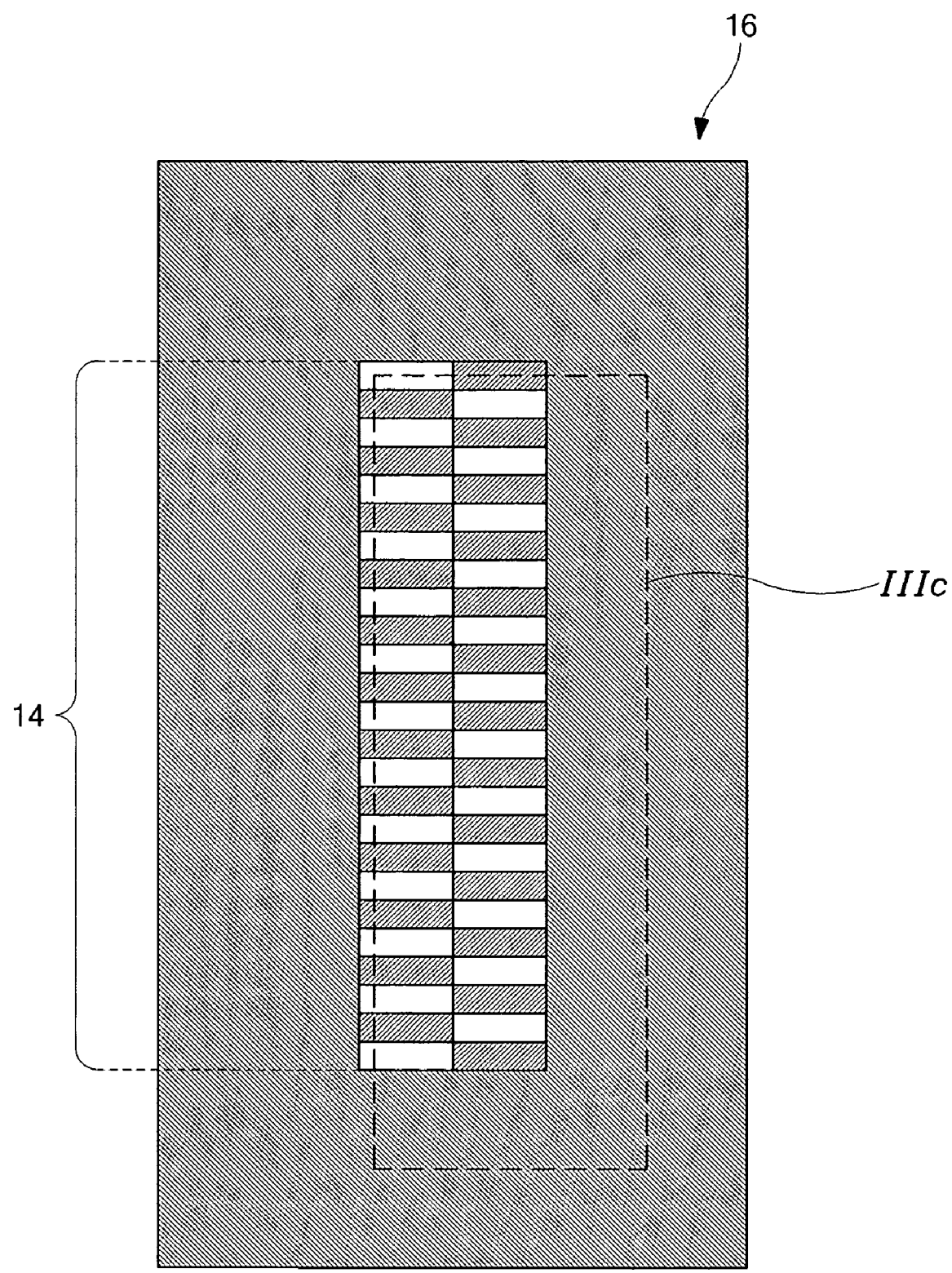
FIGS. 4A and 4B are a schematic plane view and a schematic cross-sectional view, respectively, showing misalignment of a mask for laser crystallization according to the related art.
Figure 4B:
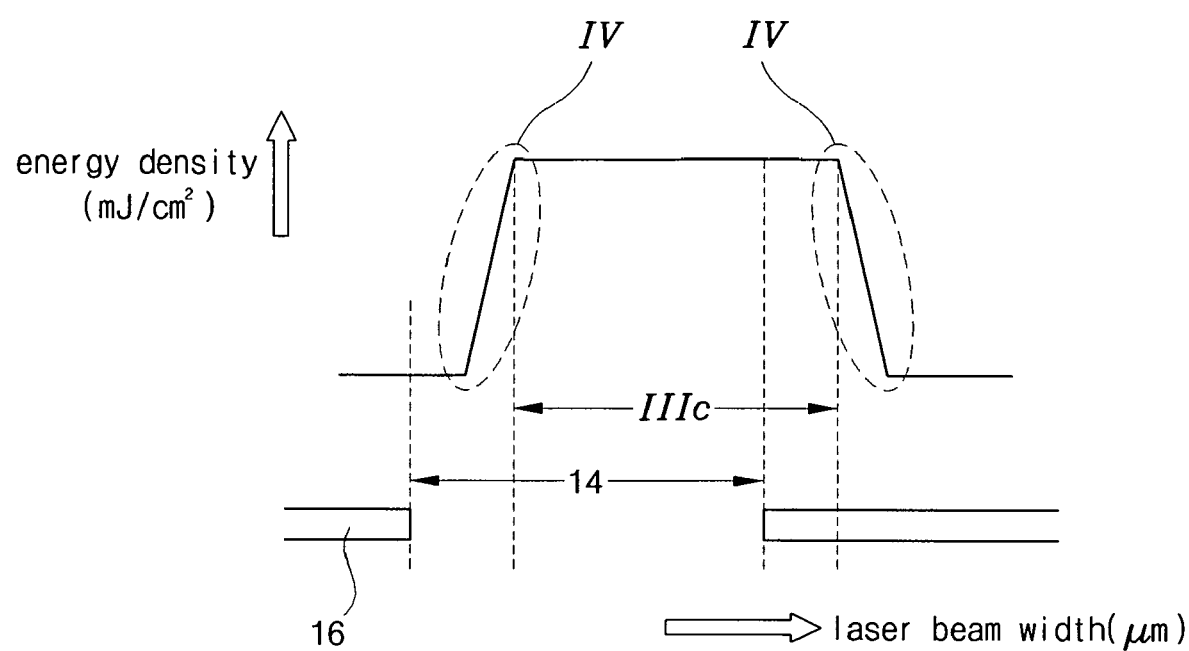
Figure 5:
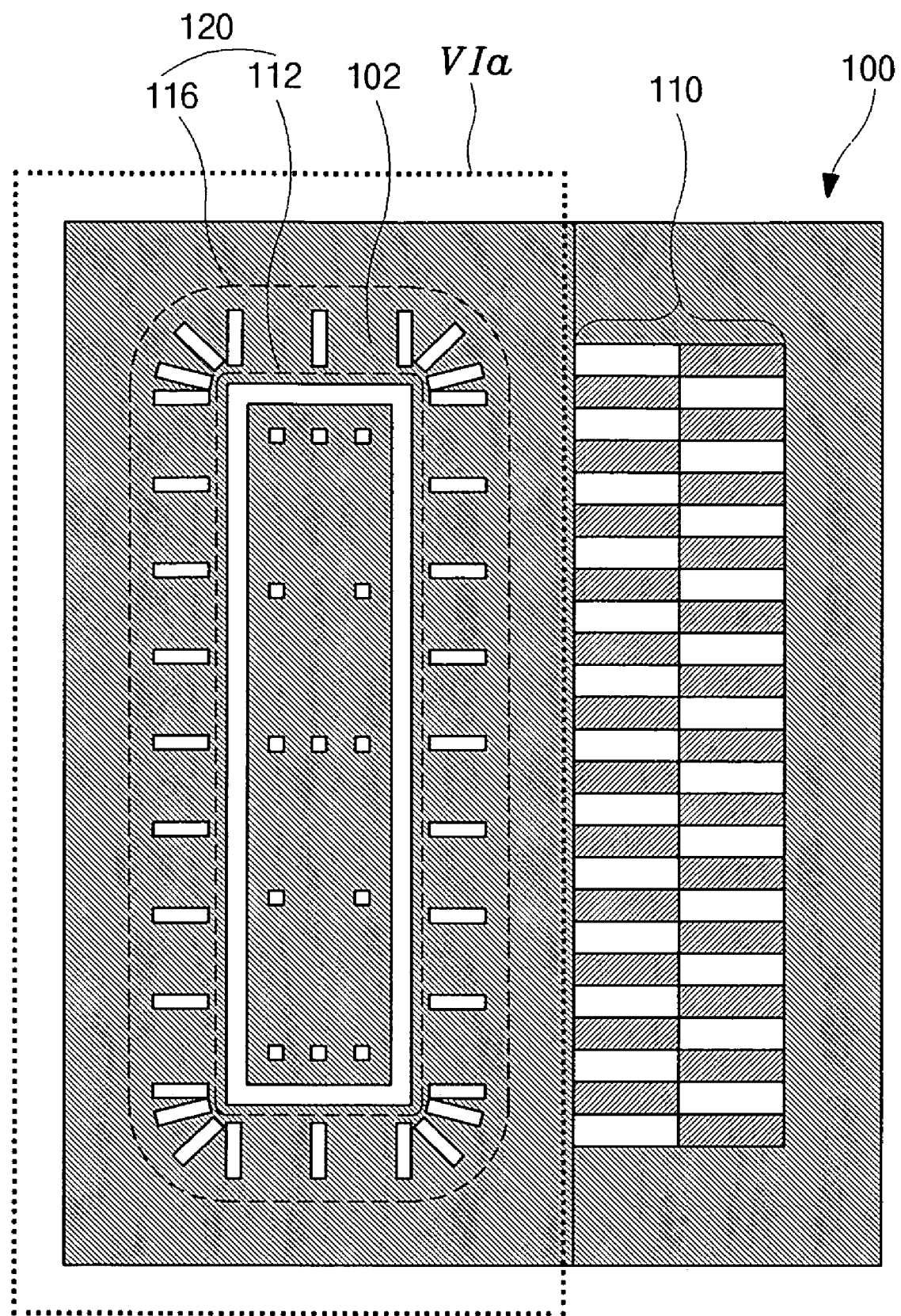
FIG. 5 is a schematic plane view showing a mask for laser crystallization according to a first embodiment of the present invention.
Figure 6:
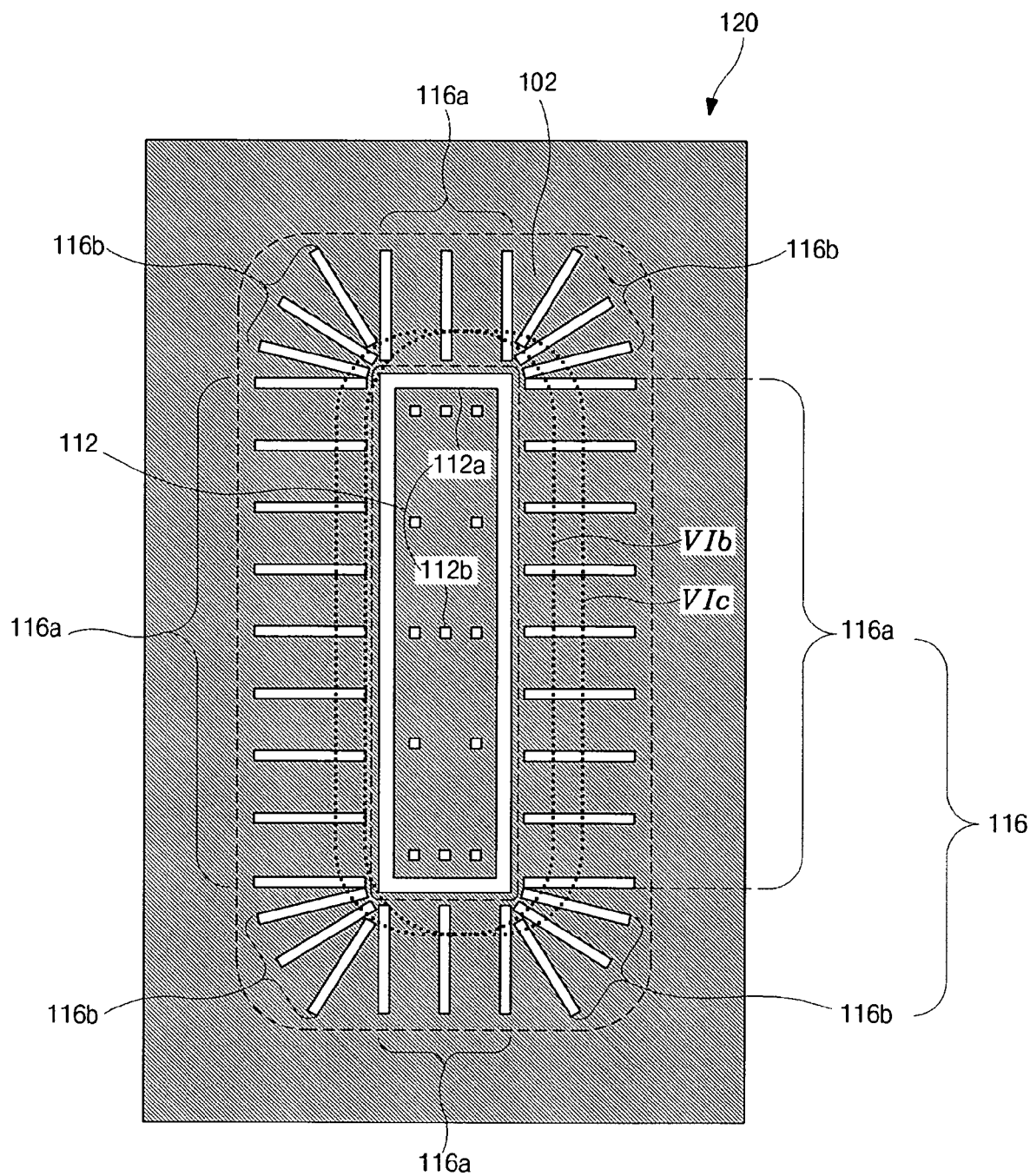
FIG. 6 is a magnified view of a portion "VIa" of FIG. 5.

FIG. 5 is a schematic plane view showing a mask for laser crystallization according to a first embodiment of the present invention and FIG. 6 is a magnified view of a portion "VIa" of FIG. 5. In FIGS. 5 and 6, a pattern corresponds to a transmissive portion through which a laser beam passes and a shaded region surrounding the pattern corresponds to a shielding portion 102 where the laser beam is blocked.

In FIG. 5, a mask 100 for laser crystallization includes a crystallization pattern 110 used for a laser crystallization process and an alignment pattern 120 adjacent to the crystallization pattern 110. The alignment pattern 120 includes a first pattern group 112 having a corresponding size to the crystallization pattern 110 and a second pattern group 116 surrounding the first pattern group 112. The second pattern group 116 has a plurality of radial bars.

In FIG. 6, the alignment pattern 120 includes a first pattern group 112 and a second pattern group 116. The first pattern group 112 consists of a first sub-pattern 112a and second sub-patterns 112b. The first sub-pattern 112a has a rectangular ring shape and a size corresponding to the crystallization pattern 110 (of FIG. 5). The second sub-patterns 112b have a square shape and are disposed inside the first sub-pattern 112a to measure uniformity in an energy density of a laser beam. The second pattern group 116 consists of third sub-patterns 116a and fourth sub-patterns 116b. The third sub-patterns 116a and the fourth sub-patterns 116b have a bar shape and are radially disposed outside the first sub-patterns 112a. The third sub-patterns 116a correspond to sides of the first sub-patterns 112a, while the fourth sub-patterns 116b correspond to edges of the first sub-patterns 112a.

The second pattern group 116 includes a plurality of radial bars to measure a position of a slope region of a laser beam. Since each bar of the second pattern group 116 is a long slit, the laser beam passes through each bar and then is irradiated onto an amorphous silicon layer to crystallize the amorphous silicon layer partially. The crystallized portion of the amorphous silicon layer, i.e., a polycrystalline silicon pattern may be distinguished from the other portion of the amorphous silicon layer because of its transmittance. The laser beam may have a cross-sectional area larger than an area surrounded by the first sub-pattern 112a and partially overlap the second pattern group 116. As a result, an alignment state between the laser beam and the mask 100 (of FIG. 5) for laser crystallization is inspected by measuring lengths of the polycrystalline layer corresponding to the second pattern group 116, especially the third sub-patterns 116a.

For example, when a first laser beam "VIb" is aligned with the mask 100 (of FIG. 5) for laser crystallization to have a first alignment state (normal centering state), a length of the polycrystalline silicon pattern corresponding to the third sub-patterns 116a outside a left side of the first sub-pattern 112a is substantially the same as a length of the polycrystalline silicon pattern corresponding to the third sub-patterns 116a outside a right side of the first sub-pattern 112a. In addition, a length of the polycrystalline silicon pattern corresponding to the third sub-patterns 116a outside a top side of the first sub-pattern 112a is substantially the same as a length of the polycrystalline silicon pattern corresponding to the third sub-patterns 116a outside a bottom side of the first sub-pattern 112a. Accordingly, the first alignment state may be estimated as a well-aligned state by comparing the lengths of the polycrystalline silicon pattern corresponding to the third sub-patterns 116a outside the sides of the first sub-pattern 112a.

However, when a second beam "VIc" is aligned with the mask 100 (of FIG. 5) for laser crystallization to have a second alignment state (abnormal centering state), the second laser beam "VIc" does not overlap the third sub-patterns 116a outside a left side of the first sub-pattern 112a. Accordingly, the second laser beam "VIc" is not irradiated onto an amorphous silicon layer corresponding to the third sub-pattern 116a outside the left side of the first sub-pattern 112a and a polycrystalline silicon pattern is not formed at a portion corresponding to the third sub-pattern 116a outside the left side of the first sub-pattern 112a. As a result, the second alignment state may be estimated as a poorly-aligned state by comparing the lengths of the polycrystalline silicon pattern corresponding to the third sub-patterns 116a outside the sides of the first sub-pattern 112a. Further, the second alignment state may be adjusted to be a well-aligned state by moving the mask 120 for laser crystallization or a laser.

Figure 7A:
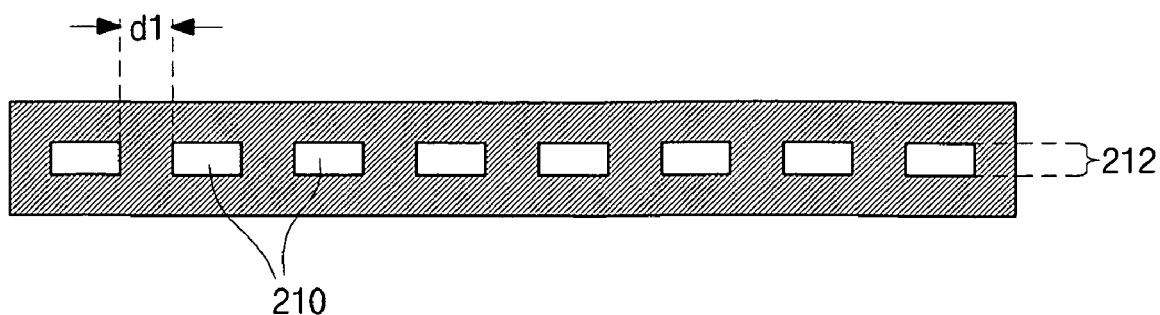
FIG. 7A is a schematic plane view showing a radial bar of a mask for laser crystallization according to a second embodiment of the present invention.
Figure 7B:
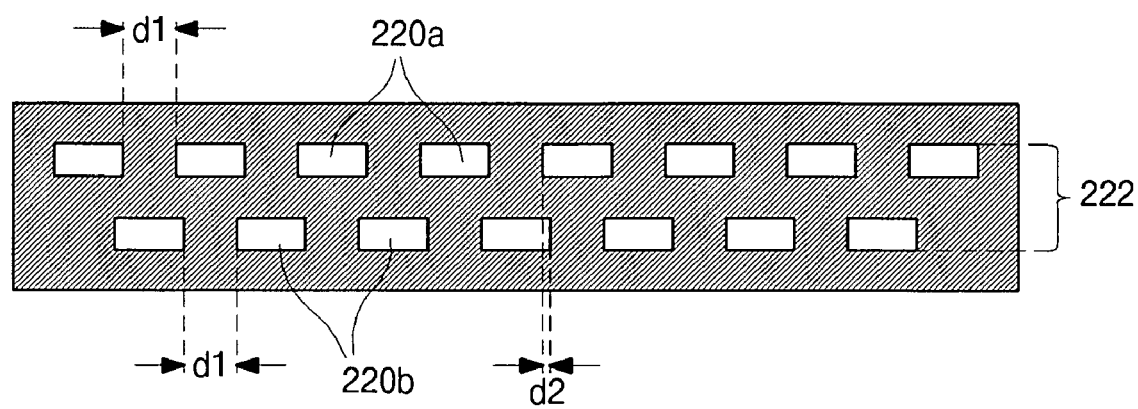
FIG. 7B is a schematic plane view showing a radial bar of a mask for laser crystallization according to a third embodiment of the present invention.

FIG. 7A is a schematic plane view showing a radial bar of a mask for laser crystallization according to a second embodiment of the present invention and FIG. 7B is a schematic plane view showing a radial bar of a mask for laser crystallization according to a third embodiment of the present invention.

In FIG. 7A, a radial bar 212 includes a plurality of sub-bars 210 spaced apart from each other with a distance "d1." The plurality of sub-bars 210 make a single virtual line. Since the radial bar 212 is divided into the plurality of sub-bars 210, a polycrystalline silicon pattern is also divided into a plurality of sub-polycrystalline silicon patterns. Accordingly, an alignment state may be easily estimated by counting a number of the sub-polycrystalline silicon patterns.

In FIG. 7B, a radial bar 222 includes a plurality of first sub-bars 220a and a plurality of second sub-bars 220b. The plurality of first sub-bars 220a make a first virtual line and the plurality of second sub-bars 220b make a second virtual line. The first and second virtual lines are parallel to each other. Even though the plurality of first sub-bars 220a are spaced apart from each other with a first distance "d1" and the plurality of second sub-bars 220b are also spaced apart from each other with the first distance "d1," each first sub-bar 220a may be disposed to overlap each second sub-bar 220b with a second distance "d2" in a vertical view. The second distance "d2" is shorter than the first distance "d1." Accordingly, a length of a laser beam overlapping the radial bar 222 may be measured with higher resolution. As a result, an alignment state may be more accurately estimated by counting a number of sub-polycrystalline silicon patterns corresponding to the first and second sub-bars 220a and 220b. In addition, the accuracy of the estimation may be adjusted by varying the second distance "d2."

Even though not shown in FIGS. 7A and 7B, a radial bar may include a plurality of sub-bars making a plurality of virtual lines. For example, when a first distance between two sub-bars making one virtual line is 1 μm and a second distance with which two sub-bars in adjacent two virtual lines overlap each other is 0.2 μm, the plurality of sub-bars may make five virtual lines parallel to each other. In addition, the second distance may be determined to be shorter than the first distance.

Furthermore, a rotation between a laser beam and a mask for laser crystallization may be estimated by using the alignment pattern. For example, when the mask for crystallization is rotated with respect to the laser beam, a length of a polycrystalline silicon pattern of a portion corresponding to a radial bar outside one side of a first sub-pattern may be different from a length of a polycrystalline silicon pattern of the other portion corresponding to the other radial bar outside the side of the first sub-pattern. The degree of rotation between the laser beam and the mask for laser crystallization may be estimated by comparing the lengths of the polycrystalline patterns. Accordingly, a center of the laser beam is aligned with a center of the alignment pattern.

The length of the polycrystalline pattern may be measured by using an image sensing means adjacent to the polycrystalline pattern, an external optical microscope or a scanning electron microscope (SEM). For example, a charge-coupled device (CCD) may be used as an image sensing means.

Figure 8:
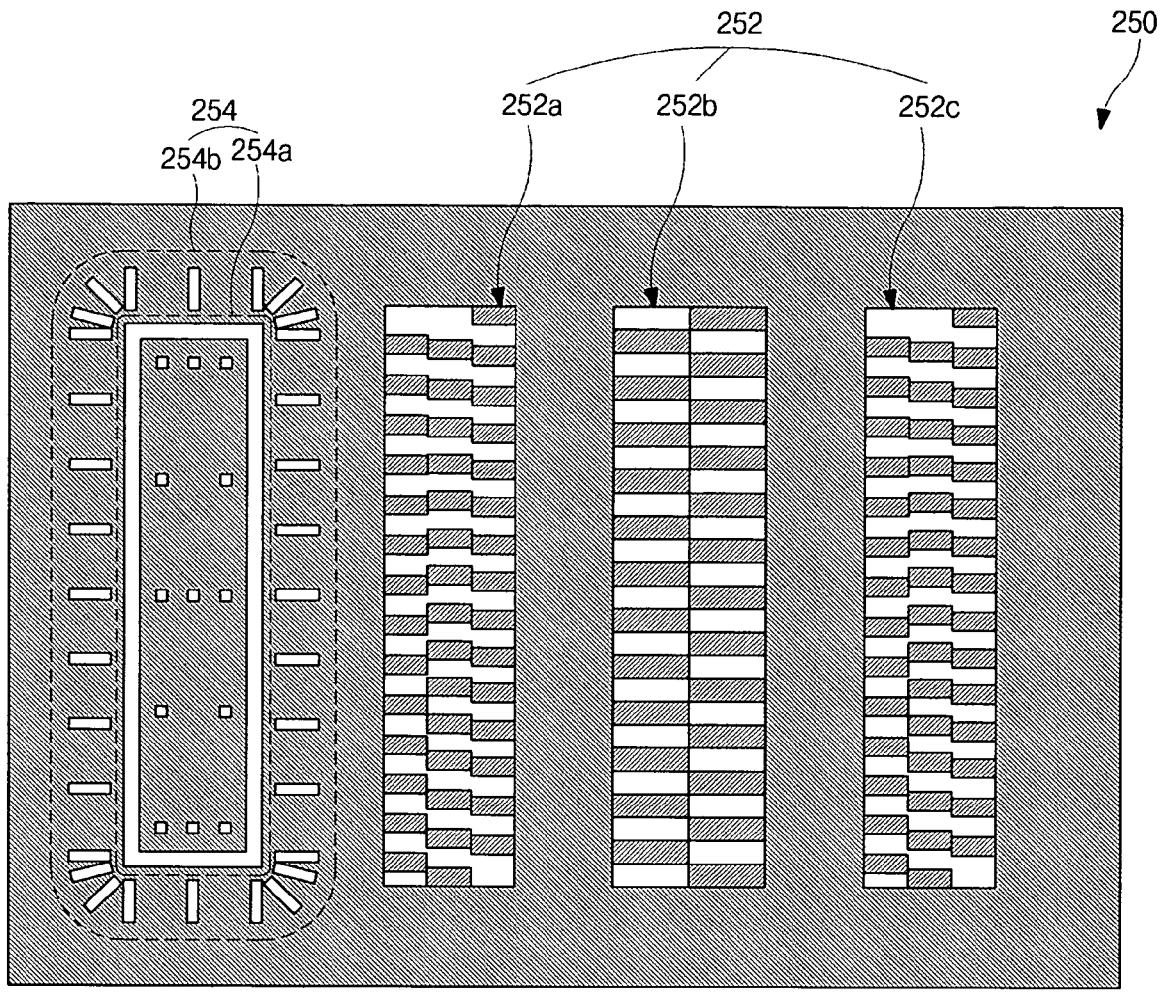
FIG. 8 is a schematic cross-sectional view showing a mask for crystallization according to a fourth embodiment of the present invention.

FIG. 8 is a schematic cross-sectional view showing a mask for crystallization according to a fourth embodiment of the present invention.

In FIG. 8, a mask 250 for laser crystallization includes a crystallization pattern 252 and an alignment pattern 254. For example, the crystallization pattern 252 may include first, second and third sub-crystallization patterns 252a, 252b and 252c different from one another. The alignment pattern 254 includes a first pattern group 254a having a size corresponding to one of the first, second and third sub-crystallization pattern 252a, 252b and 252c and a second pattern group 254b surrounding the first pattern group 254a. The second pattern group 254b has a plurality of radial bars.

Before crystallizing an amorphous silicon layer using a laser beam, the laser beam is aligned with the mask for laser crystallization by using the alignment pattern 254, i.e., measuring a length of polycrystalline silicon patterns corresponding to the radial bars of the second pattern group 254b. After aligning the laser beam with the mask for crystallization, the mask for laser crystallization moves such that the laser beam is irradiated onto the amorphous silicon layer through one of the first, second and third sub-crystallization patterns 252a, 252b and 252c. The laser beam may move instead of moving the mask for laser crystallization in another embodiment. Since the laser beam is exactly pre-aligned with the mask for laser crystallization, misalignment of the laser beam is minimized and process time is reduced even in a process where the mask for laser crystallization is frequently linearly moved and rotated. Accordingly, crystallinity and uniformity of polycrystalline silicon are improved.

Figure 9:
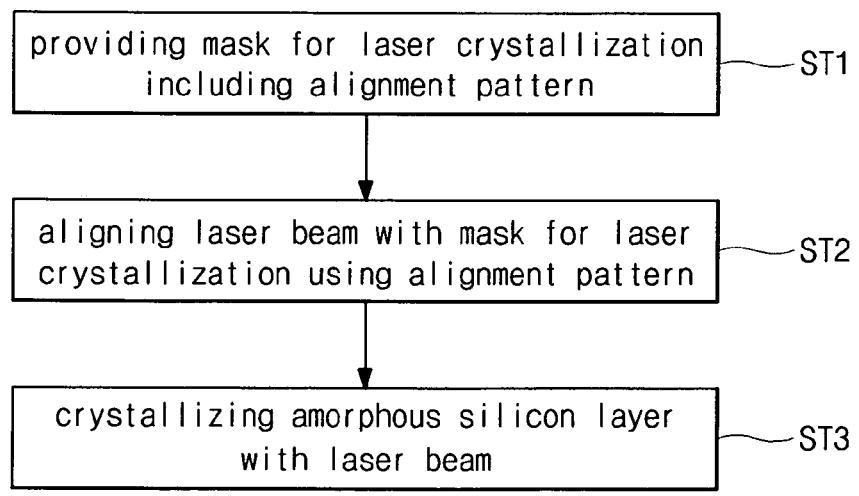
FIG. 9 is a schematic block diagram showing a crystallization method using a mask for laser crystallization according to an embodiment of the present invention

FIG. 9 is a schematic block diagram showing a crystallization method using a mask for laser crystallization according to an embodiment of the present invention.

At step ST1, a mask for laser crystallization is provided over an amorphous silicon layer. The mask for laser crystallization includes a crystallization pattern and an alignment pattern consisting of a first pattern group and a second pattern group. The first pattern group corresponds to the crystallization pattern and the second pattern group has a plurality of radial bars surrounding the first pattern group. The radial bar may be a long single slit or a plurality of sub-bars making a single virtual line. In addition, the radial bar may be a plurality of sub-bars making a plurality of virtual lines parallel to each other. The crystallization pattern may include a plurality of sub-crystallization patterns for different crystallization conditions.

At step ST2, a laser beam is aligned with the mask for crystallization using the alignment pattern. Before crystallizing the amorphous silicon layer using the crystallization pattern, the laser beam is irradiated through the alignment pattern to form a polycrystalline silicon pattern corresponding to the alignment pattern. An alignment state between the laser beam and the mask for laser crystallization is estimated by measuring symmetry of the polycrystalline silicon pattern. The laser beam is re-aligned with the mask for laser crystallization according to the estimation results. The laser beam may be re-aligned when the mask for laser crystallization is changed or when a crystallization step is started. Moreover, the laser beam may be re-aligned several times during a long crystallization step.

At step ST3, the amorphous silicon layer is crystallized with the laser beam. After aligning the laser beam with the mask for laser crystallization, the mask for laser crystallization may relatively move so that the laser beam can be irradiated onto the amorphous silicon layer through the crystallization pattern. The laser beam may have an energy density corresponding to a complete melting regime and the amorphous silicon layer may be crystallized using a SLS method.

In the present application, a laser beam is aligned with a mask for laser crystallization having an alignment pattern and a crystallization pattern before crystallizing an amorphous silicon layer. Accordingly, a top hat region of the laser beam is entirely utilized for crystallization. Moreover, the laser beam is further exactly and easily aligned with the mask for laser crystallization by using a plurality of sub-bars for the alignment pattern. In addition, since several portions of the amorphous silicon layer can be crystallized under different crystallization conditions with a single mask for laser crystallization, process efficiency is improved and fabrication cost is reduced. Therefore, production yield is further improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A mask comprising:
   a transmissive portion defining a crystallization pattern and an alignment pattern, the alignment pattern including a first pattern group having substantially the same size as the crystallization pattern and a second pattern group having a plurality of sub-patterns surrounding the first pattern group; and
   a shielding portion surrounding the transmissive portion.

2. The mask according to claim 1, wherein each sub-pattern comprises a radial bar.

3. The mask according to claim 2, wherein each radial bar includes a single slit.

4. The mask according to claim 2, wherein each radial bar includes a plurality of sub-bars spaced apart from each other.

5. The mask according to claim 4, wherein the plurality of sub-bars are aligned along a line.

6. The mask according to claim 4, wherein the plurality of sub-bars are aligned along a plurality of lines.

7. The mask according to claim 6, wherein the sub-bars in one line overlap the sub-bars in another line.

8. The mask according to claim 7, wherein a distance between the adjacent sub-bars in the one line is longer than an overlap distance between the sub-bars in the one line and the sub-bars in the other line.

9. The mask according to claim 1, wherein the crystallization pattern includes at least one sub-crystallization pattern.

10. The mask according to claim 9, wherein the at least one sub-crystallization pattern comprises a plurality of different sub-crystallization patterns.

11. The mask according to claim 1, wherein the crystallization pattern includes a plurality of slits spaced apart from each other.

12. The mask according to claim 1, wherein each sub-pattern consists of a radial bar.

13. A method comprising:
providing a mask that includes a transmissive portion and a shielding portion surrounding the transmissive portion, the transmissive portion defining a crystallization pattern and an alignment pattern, the alignment pattern including a first pattern group having substantially the same size as the crystallization pattern and a second pattern group having a plurality of sub-patterns surrounding the first pattern group;
irradiating an amorphous silicon layer using a first laser beam that passes through the alignment pattern, the irradiated amorphous silicon forming a polycrystalline silicon pattern;
aligning the first laser beam with the mask by measuring symmetry of the polycrystalline silicon pattern; and
irradiating the amorphous silicon layer using a second laser beam that passes through the crystallization pattern.

14. The method according to claim 13, wherein each sub-pattern comprises a radial bar.

15. The method according to claim 13, wherein aligning the first laser beam includes aligning a center of the first laser beam with a center of the alignment pattern.

16. The method according to claim 13, wherein aligning the first laser beam comprises:
measuring the polycrystalline silicon pattern; and
moving one of the first laser beam and the mask.

17. The method according to claim 14, wherein each radial bar includes a plurality of sub-bars spaced apart from each other and the polycrystalline silicon pattern includes a plurality of sub-polycrystalline silicon patterns corresponding to the plurality of sub-bars.

18. The method according to claim 17, wherein aligning the first laser beam includes counting a number of the sub-polycrystalline silicon patterns.

19. The method according to claim 18, wherein the number of the sub-polycrystalline silicon patterns is counted by using one of image sensing means, an optical microscope and a scanning electron microscope.

20. The method according to claim 19, wherein the image sensing means is a charge-coupled device.

21. The method according to claim 13, wherein the second laser beam has an energy density corresponding to a complete melting regime for the amorphous silicon layer and the amorphous silicon layer is crystallized by sequential lateral solidification.

22. A mask comprising:
a transmissive portion defining a crystallization pattern and an alignment pattern, the alignment pattern including a first pattern group and a second pattern group disposed around the first pattern group such that the second pattern group is substantially symmetrical around a line passing through a center of the second pattern group; and
a shielding portion surrounding the transmissive portion.

23. The mask according to claim 22, wherein the first pattern group is substantially the same size as the crystallization pattern.

24. The mask according to claim 22, wherein the second pattern group contains a plurality of radial bars.

25. The mask according to claim 22, wherein the second pattern group contains a plurality of sub-patterns that extend substantially radially from a center of the first pattern group.

26. The mask according to claim 25, wherein at least one of the sub-patterns contains multiple elements radially separated from each other.

27. The mask according to claim 26, wherein the elements of one of the sub-patterns overlap with the elements of another of the sub-patterns.

28. The mask according to claim 27, wherein the overlapping elements of the sub-patterns overlap in a non-radial direction.

29. The mask according to claim 28, wherein an amount of overlap between the overlapping elements in adjacent sub-patterns is less than a distance between adjacent elements in one of sub-patterns of the adjacent sub-patterns.

30. The mask according to claim 22, wherein the first pattern group is substantially symmetrical along a line passing through a center of the first pattern group.

31. The mask according to claim 22, wherein the first and second pattern groups have the same center.

32. The mask according to claim 22, wherein the first pattern group contains a plurality of sub-patterns.

33. The mask according to claim 32, wherein the sub-patterns comprise a ring having substantially the same size as the crystallization pattern and elements disposed within the ring.

34. The mask according to claim 33, wherein the elements are disposed substantially uniformly inside the ring.

35. The mask according to claim 22, wherein the crystallization pattern includes a plurality of sub-crystallization patterns.

36. The mask according to claim 35, wherein the sub-crystallization patterns are different.

* * * * *